United States Patent [19]

Davis

[11] Patent Number: 4,668,755
[45] Date of Patent: May 26, 1987

[54] HIGH MOLECULAR WEIGHT SILOXANE POLYIMIDES, INTERMEDIATES THEREFOR, AND METHODS FOR THEIR PREPARATION AND USE

[75] Inventor: Gary C. Davis, Albany, N.Y.

[73] Assignee: General Electric Company, Schenectady, N.Y.

[21] Appl. No.: 639,640

[22] Filed: Aug. 10, 1984

[51] Int. Cl.[4] ............................................. C08G 73/10
[52] U.S. Cl. ...................................... 528/26; 528/125; 528/128; 528/172; 528/188
[58] Field of Search ................. 528/26, 125, 128, 172, 528/188

[56] References Cited

U.S. PATENT DOCUMENTS

| 3,325,450 | 6/1967 | Holub | 528/26 |
| 3,740,305 | 6/1973 | Hoback et al. | 528/26 |
| 4,030,948 | 6/1977 | Berger | 528/26 |
| 4,520,075 | 5/1985 | Igarashi et al. | 528/26 |

FOREIGN PATENT DOCUMENTS 8168624 10/1983 Japan ..................................... 528/26

OTHER PUBLICATIONS

Duran et al., "Ultrapure Polyimides: Syntheses and Applications", from Davidson, *Polymers in Electronics* (1984), pp. 239–258.

*Primary Examiner*—John Kight
*Assistant Examiner*—M. L. Moore
*Attorney, Agent, or Firm*—William H. Pittman; James C. Davis, Jr.; James Magee, Jr.

[57] ABSTRACT

High molecular weight siloxane polyamic acids and polyimides are prepared by the reaction of dianhydrides with diamines in a polar aprotic solvent, all of the reagents and solvent being highly purified and substantially anhydrous. The polyamic acids may be coated on substrates and baked to form polyimide dielectric layers. When so used, they are free from certain disadvantages of lower molecular weight polymers, especially undercutting and scum formation during photolithography and etching procedures.

15 Claims, No Drawings

HIGH MOLECULAR WEIGHT SILOXANE POLYIMIDES, INTERMEDIATES THEREFOR, AND METHODS FOR THEIR PREPARATION AND USE

This invention relates to non-conductive condensation polymers, intermediates in their preparation, a method for their preparation and uses therefor.

Various electrically non-conductive polyimides are known in the art, as are their uses as insulators and dielectrics in electronic circuits. These polyimides are frequently prepared in a two-step procedure, the first step being the reaction of a dianhydride with a diamine to produce a polyamic acid. The polyamic acid is then coated on a substrate and baked to produce the polyimide dielectric layer.

In microelectronic applications, it is frequently convenient to employ photolithographic operations to pattern the dielectric. Typically, polyamic acid and photoresist layers are successively coated on the substrate. The photoresist layer is masked, exposed and developed, after which the polyamic acid is etched, the photoresist is stripped and the polyamic acid is baked to form the patterned polyimide dielectric layer.

Both dry etching and wet etching processes have been used to etch dielectric or dielectric precursor layers. In dry etching, the photoresist is exposed and developed as described above and etching is accomplished by plasma, reactive ion or similar techniques. These processes are generally effective to produce clean patterns with dielectric portions having substantially vertical edges. However, dry etching processes are relatively cumbersome, often necessitating the application of a silicon dioxide barrier layer between the dielectric and photoresist layers. They are also labor-intensive, and the results thereof are occasionally non-reproducible.

Wet etching processes employ an etching solution, typically alkaline. Since alkaline developing solutions are also used under most circumstances, it is usually possible to employ a single solution to develop the positive photoresist and simultaneously etch the polyamic acid layer.

Among the polyimides known to be useful as insulating materials are siloxane polyimides. Reference is made, for example, to U.S. Pat. Nos. 3,325,450 and 3,435,002 the disclosures are which are incorporated by reference herein. The siloxane polyimides possess properties which would be advantageous in dielectrics for a number of applications, including microelectronic applications. For example, they form highly planar coatings and adhere well to substrates without the application of primers. However, wet etching processes for patterning the precursor siloxane polyamic acids have certain disadvantages which have inhibited the use of siloxane polyimide dielectrics.

One such disadvantage is the tendency of alkaline etching solutions to severely undercut the photoresist. This can result in uneven line and space widths, and in particular in spaces substantially wider than those in the photoresist mask. Another disadvantage is the tendency of the siloxane polyamic acids to deposit a scum upon contact with the etching solution. This scum is insoluble in alkali and can therefore cause incomplete etching, particularly when the thickness of the dielectric layer is greater than about 4 microns. It can also remain on the underlying conductive substrate, making difficult or impossible the production of electrical contacts and the like.

A principal object of the present invention, therefore, is to produce siloxane polyimides which are useful as dielectrics, as well as polyamic acid intermediates therefor.

A further object is to produce siloxane polyamic acids which may be easily and accurately patterned by photolithography-wet etching techniques.

Another object is to produce siloxane polyamic acids which are easily and completely removed by alkaline etching solutions.

A still further object is to provide a method for preparing siloxane polyimides and their polyamic acid intermediates.

A still further object is to provide electronic devices, optionally on the microelectronic scale, having dielectric layers comprising siloxane polyimides with the above-described properties, as well as a wet etching method for their manufacture.

Other objects will in part be obvious and will in part appear hereinafter.

The present invention is based on the discovery that the relatively low molecular weight of previously known siloxane polyamic acids and the polyimides prepared therefrom is a principal obstacle to the use of said polyamic acids as dielectric precursors, especially in microelectronic applications. This is true because low molecular weight polymers of this type are particularly susceptible to undercutting and scum deposition during the wet etching operation.

One aspect of the present invention, therefore, is nitrogen- and silicon-containing copolymers consisting essentially of structural units having the formula

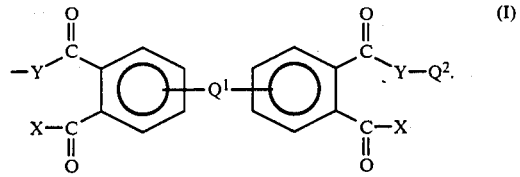

and containing an average of at least 50 of said units per copolymer molecule, wherein:

$Q^1$ is at least one divalent linking radical consisting of atoms selected from the group consisting of carbon, hydrogen, nitrogen, oxygen and sulfur and containing no carbon-carbon or carbon-nitrogen multiple bonds;

each $Q^2$ is independently an aromatic hydrocarbon radical or a divalent radical having the formula

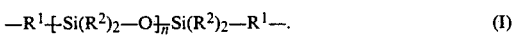

at least about 10 mole percent of said $Q^2$ radicals having formula II;

$R^1$ is an alkylene radical;

$R^2$ is a lower alkyl or lower aromatic hydrocarbon radical;

X is OH and Y is NH, or X and Y taken together are N; and n is at least 1.

As will be apparent from the foregoing, the copolymers of this invention are relatively high molecular weight siloxane polyimides or polyamic acids of the type prepared by the reaction of dianhydrides with diamines. In the dianhydride-derived portion of the molecule, $Q^1$ may be any of a wide variety of linking radicals containing carbon, hydrogen, nitrogen, oxygen and sulfur atoms. Said linking radical may be any of several art-recognized linking groups or combinations thereof, illustrated by alkylene, arylene, carbonyl, amino (including both NH and $NR^3$ wherein $R^3$ is alkyl or aryl), ether, sulfide, sulfone and the like. Combinations of the foregoing radicals include, for example, 2,2-bis(4-oxyphenyl), p-phenylenediamino and m-phenylenedithio. Especially preferred is the carbonyl radical. The $Q^1$ value may be attached to the benzenedicarboxylic acid moieties of formula I in the 2- or 3-positions, preferably the 3-position.

Each $Q^2$ value is independently an aromatic hydrocarbon radical [e.g., m-phenylene, p-phenylene or bis(4-phenylene)methylene, preferably the latter] or a radical having formula II, wherein $R^1$ is alkylene and $R^2$ is a lower alkyl or lower aromatic hydrocarbon radical (i.e., one containing up to 7 carbon atoms). Most often, $R^1$ is a straight chain $C_{3-5}$ alkylene radical and especially the trimethylene radical, and $R^2$ is methyl or phenyl and especially methyl. The value of n is at least 1, usually from 1 to about 1000 and preferably about 1–10. At least about 10 mole percent of the $Q^2$ values in the copolymer, and preferably about 25–40 mole percent, have formula II.

A critical feature of the copolymers of this invention is the average number of structural units per copolymer molecule. This value is determined by dividing the number average molecular weight of the polymer by the average molecular weight of a structural unit. The minimum value according to the invention is 50. Most often, the value is at least 100, and it is preferably at least 150.

Siloxane polyamic acids comprising structural units having formula I may be prepared by the known reaction of (A) at least one dianhydride having the formula,

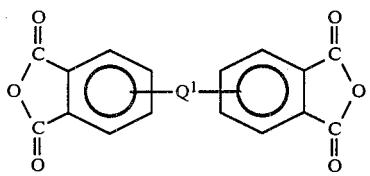

(III)

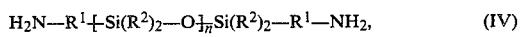

with (B) at least one siloxane diamine having the formula $$H_2N-R^1-[Si(R^2)_2-O]_n Si(R^2)_2-R^1-NH_2, \qquad (IV)$$

wherein $R^1$, $R^2$ and n are as previously defined, or a mixture thereof with (C) at least one aromatic diamine having the formula

$$H_2N-A-NH_2 \qquad (V)$$

wherein A is an aromatic hydrocarbon radical, said mixture comprising at least about 10 mole percent of reagent B, in (D) a polar aprotic solvent. It has been discovered in accordance with the present invention, however, that siloxane polyamic acids prepared by this reaction under normal conditions have molecular weights so low that the corresponding siloxane polyimides are subject to the previously described disadvantages of undercutting and scum formation. Another aspect of the present invention is the discovery that copolymers having a molecular weight sufficiently high to be free of these disadvantages may be prepared by employing highly purified and substantially anhydrous materials as reagents A, B and C and solvent D. The purification of these materials may be effected by known methods. Thus, solid reagents may be recrystallized, while liquids may be dried by contact with a suitable drying agent such as silica gel, magnesium sulfate, calcium chloride or molecular sieves and/or may be distilled. All reagents should then be stored under substantially anhydrous conditions.

The polar aprotic solvents useful in the method of this invention include, for example, N-methylpyrrolidone, dimethylformamide, dimethylacetamide and dimethyl sulfoxide. N-Methylpyrrolidone is preferred.

The preparation of the relatively high molecular weight siloxane polyamic acid copolymers of this invention is illustrated by the following example.

EXAMPLE 1

3,3',4,4'-Benzophenonetetracarboxylic acid dianhydride, 54 grams (0.17 mole), was dissolved in 250 ml. of N-methylpyrrolidone. A mixture of 23.22 grams (0.12 mole) of bis(4-aminophenyl)methane and 12.6 grams (0.05 mole) of 1,3-bis(3-aminopropyl)tetramethyldisiloxane was added and the mixture was stirred at room temperature for 24 hours. The commercial dianhydride was recrystallized from a mixture of acetic acid and acetic anhydride; the diamine was recrystallized from toluene; the siloxane diamine was distilled under vacuum; and the N-methylpyrrolidone was dried over 4-Angstrom molecular sieves. The purity data are given in TABLE I.

TABLE I

| Material | Purity grade | Property | Original value | Final value |
| --- | --- | --- | --- | --- |
| Dianhydride | Commercial | Melting pt. | 218–220° C. | 224–226° C. |
| Bis(4-aminophenyl)methane | Reagent | Melting pt. | 88–93° C. | 92–93° C. |
| Siloxane diamine | Reagent | Boiling pt. | — | 133° C./10 torr |
| Solvent | Reagent | Water content | 640 ppm. | 122 ppm. |

The siloxane polyamic acid obtained had a number average molecular weight (determined by gel permeation chromatography) of 99,000, corresponding to about 184 structural units per molecule. A control polymer prepared from non-purified materials had a number average molecular weight of 12,000, corresponding to about 22 structural units.

The copolymers of this invention are, as previously noted, particularly useful as dielectrics in electronic circuits. Accordingly, another aspect of the invention is an improvement in an electronic device comprising conductive and dielectric elements, said improvement comprising the use as at least a portion of said dielectric elements of a copolymer of this invention wherein X and Y taken together are N. Still another aspect is a method for preparing an electronic device which includes the steps of:

depositing on a conductive substrate a coating of a siloxane polyamic acid copolymer as described herein wherein X is OH and Y is NH;

depositing a photoresist layer on said copolymer coating;

exposing and developing said photoresist layer;

etching said copolymer coating with an aqueous alkaline solution;

stripping said photoresist layer; and baking said copolymer coating to form a dielectric siloxane polyimide copolymer wherein X and Y taken together are N.

The first step in the method of this invention is the formation of a siloxane polyamic acid coating on a conductive substrate, normally a metal substrate. The siloxane polyamic acid coating is ordinarily formed by spin-coating operations involving a solution of the polyamic acid in a suitable solvent, as disclosed hereinabove.

The polyamic acid coating is then patterned by photolithographic process including the conventional steps of photoresist deposition, exposure and development. In a preferred embodiment of the invention, development of the photoresist and etching of the siloxane polyamic acid coating are accomplished simultaneously by contact with an aqueous alkaline solution, typically a sodium hydroxide or potassium hydroxide or tetraalkylammonium hydroxide solution having a concentration of about 0.1–1.0M and especially about 0.2–0.5M. The temperature of the etching-development step is ordinarily about 20°–50° C. and usually about 25°–30° C.

Following the etching step, the photoresist layer is stripped with an organic solvent (e.g., an ester such as ethyl acetate) and the patterned siloxane polyamic acid is baked, generally at temperatures within the range of about 100°–350° C., to produce the desired polyimide dielectric elements in the form of lines or bars separated by spaces or holes adapted to the deposition of further conductive elements for electrical contacts.

The invention is particularly adapted to microelectronic circuitry wherein at least a portion of said dielectric elements are separated by lateral distances of at most 10 microns. However, it may also be used for the production of circuits of larger dimension.

The utility of the siloxane polyimides of this invention as dielectrics in microelectronic circuits is illustrated by the following example.

EXAMPLE 2

The copolymer product of Example 1, dissolved in N-methylpyrrolidone, was spin-coated on metal substrates to produce polyamic acid layers of a thickness which would be converted upon baking to 6-micron polyimide dielectric layers. The solvent was removed by drying for 1 hour at specific temperatures from 90° to 130° C., after which a conventional novolac photoresist was applied and masked to produce a pattern of dielectric lines 250 microns wide separated by 100-micron spaces.

The photoresist was developed and the polyamic acid etched by contact for 4 minutes with 0.35M aqueous sodium hydroxide solution. The photoresist was then stripped with ethyl acetate and the polyamic acid was converted to the desired polyimide dielectric layer by baking for 1 hour each at 100°, 200° and 300° C.

The depth of completion of the etching process and the percent undercut obtained at various drying temperatures is listed in TABLE II. The percent undercut was determined by the formula $(1 - B/A) \times 100$, wherein A is the mask line width (i.e., 250 microns) and B is the line width actually produced in the dielectric.

TABLE II

| Drying temp., °C. | Example 1 | | Control | |
|---|---|---|---|---|
| | % devel. | % undercut | % devel. | % undercut |
| 90 | 100 | 13 | 100 | 61 |
| 100 | 100 | 4 | 100 | 22 |
| 110 | 100 | 3 | 42 | — |
| 120 | 100 | 0 | 4 | — |
| 130 | 23 | 0 | 0 | — |

What is claimed is:

1. A nitrogen- and silicon-containing copolymer consisting essentially of structural units having the formula

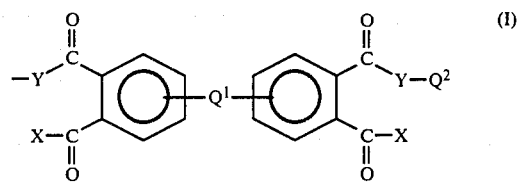

and containing an average of at least 50 of said units per copolymer molecule, wherein:

$Q^1$ is at least one divalent linking radical consisting of atoms selected from the group consisting of carbon, hydrogen, nitrogen, oxygen and sulfur and containing no carbon-carbon or carbon-nitrogen multiple bonds;

each $Q^2$ is independently an aromatic hydrocarbon radical or a divalent radical having the formula $$-R^1 + Si(R^2)_2 - O \!\!\! \frac{}{n} Si(R^2)_2 - R^1 -, \quad (II)$$

at least about 10 mole percent of said $Q^2$ radicals having formula II;

$R^1$ is an alkylene radical;

$R^2$ is a lower alkyl or lower aromatic hydrocarbon radical;

X is OH and Y is NH, or X and Y taken together are N; and n is at least 1.

2. A copolymer according to claim 1, which contains an average of at least 100 of said units.

3. A copolymer according to claim 2 wherein each $Q^2$ value which is an aromatic hydrocarbon radical is m-phenylene, p-phenylene or bis(4-phenylene)methylene, $R^1$ is a straight chain $C_{3-5}$ alkylene radical and $R^2$ is methyl or phenyl.

4. A copolymer according to claim 3 wherein $Q^1$ is carbonyl.

5. A copolymer according to claim 4 wherein about 25–40 mole percent of the $Q^2$ radicals have formula II, n is about 1–10, $R^1$ is trimethylene and $R^2$ is methyl.

6. A method for preparing a copolymer according to claim 1 wherein X is OH and Y is NH which comprises reacting (A) at least one dianhydride having the formula

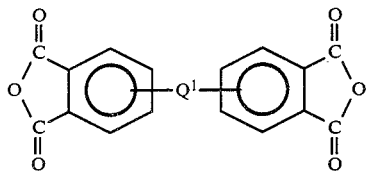
(III)

with (B) at least one siloxane diamine having the formula

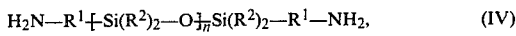

or a mixture thereof with (C) at least one aromatic diamine having the formula $$H_2N-A-NH_2 \qquad (V),$$

wherein A is an aromatic hydrocarbon radical, said mixture comprising at least about 10 mole percent of reagent B, in (D) a polar aprotic solvent; each of reagents A, B and C and solvent D being highly purified and substantially anhydrous.

7. A method according to claim 6 wherein all solid reagents have been recrystallized and all liquids have been dried by contact with a suitable drying agent, distilled or both.

8. A method according to claim 7 wherein each $Q^2$ value which is an aromatic hydrocarbon radical is m-phenylene, p-phenylene or bis(4-phenylene)methylene, $R^1$ is a straight chain $C_{3-5}$ alkylene radical and $R^2$ is methyl or phenyl.

9. A method according to claim 8 wherein $Q^1$ is carbonyl, about 25–40 mole percent of the $Q^2$ radicals have formula II, n is about 1–10, $R^1$ is trimethylene, $R^2$ is methyl and the solvent is N-methylpyrrolidone.

10. In an electronic device comprising conductive and dielectric elements, the improvement whereby at least a portion of said dielectric elements comprise a copolymer according to claim 1 wherein X and Y taken together are N.

11. A device according to claim 10 wherein the copolymer contains an average of at least 100 of said units.

12. A device according to claim 11 wherein each $Q^2$ value which is an aromatic hydrocarbon radical is m-phenylene, p-phenylene or bis(4-phenylene)methylene, $R^1$ is a straight chain $C_{3-5}$ alkylene radical and $R^2$ is methyl or phenyl.

13. A device according to claim 12 wherein at least a portion of said dielectric elements are separated by lateral distances of at most 10 microns.

14. A device according to claim 13 wherein $Q^1$ is carbonyl.

15. A device according to claim 14 wherein about 24–40 mole percent of the $Q^2$ radicals have formula II, n is about 1–10 and $R^1$ is trimethylene.

* * * * *